(12) United States Patent
Kawaguchi

(10) Patent No.: US 6,278,637 B1
(45) Date of Patent: Aug. 21, 2001

(54) SRAM GENERATING AN ECHO CLOCK SIGNAL

(75) Inventor: Yasunari Kawaguchi, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/632,832

(22) Filed: Aug. 4, 2000

(30) Foreign Application Priority Data

Aug. 10, 1999 (JP) .................................................. 11-226983

(51) Int. Cl.[7] .................................................. G11C 16/04

(52) U.S. Cl. ................ 365/189.05; 365/233; 365/189.11

(58) Field of Search ............................... 365/189.05, 233, 365/189.11, 189.01, 230.08

(56) References Cited

U.S. PATENT DOCUMENTS 6,160,742 * 12/2000 Chung et al. .................... 365/189.05

* cited by examiner

Primary Examiner—David Nelms
Assistant Examiner—David Lam
(74) Attorney, Agent, or Firm—Hutchins, Wheeler & Dittmar

(57) ABSTRACT

A pipe-line processing/burst read SRAM generates an echo clock signal concurrently with the output timing of read data. The memory cell array includes a pair of memory cells storing a high level data and a low level data. The echo clock signal is generated by reading data from the pair of memory cells and alternately outputting the read data. The timing of the echo clock signal is concurrent with the output timing of read data from a data output section which reads data from a memory cell specified by a read address.

8 Claims, 12 Drawing Sheets

SRAM GENERATING AN ECHO CLOCK SIGNAL

BACKGROUND OF THE INVENTION (a) Field of the Invention

The present invention relates to a SRAM generating an echo clock signal and, more particularly, to a SRAM including an echo clock generator for generating an echo clock signal at the timing of the output of read data.

(b) Description of the Related Art

Recent developments of the performance of personal computers are partly due to a pipe-line processing and burst read SRAM (PBSRAM) which is used as a secondary cache memory in the personal computers. With the developments of the high-speed capability of the personal computers, the PBSRAM is also requested to have a higher-speed operational capability.

In a double data rate PBSRAM wherein two cell data are read out at a single clock cycle, the data are output at the rate corresponding to the frequency which is double the operational frequency of the PBSRAM. For example, for an operational frequency of 250 MHz or a clock cycle of 4 ns (nanosecond) of the DDR-PBSRAM, the clock access rate corresponds to 2 ns or 500 MHz.

A new type of PBSRAM generates a reference signal called "echo clock signal", which informs the timing of the output of read data to the CPU when the read data is delivered from the PBSRAM, thereby compensating the irregularity of the output timing of the read data.

FIG. 1A shows a timing chart for the echo clock signal together with the read data in a single data rate PBSRAM (SDR-PBSRAM). In the drawing, CLK, ADD, AC and GW are external clock signal, address signal, address control signal and write enable signal, respectively, which are supplied from outside the PBSRAM. If the write enable signal GW assumes a high level when the address control signal AC is at a low level, the PBSRAM operates for reading data from memory cells, whereas if the write enable signal GW assumes a low level when the address control signal AC is at a low level, the PBSRAM operates for writing data to the memory cells.

The PBSRAM delivers a read data DQ and an echo clock signal KQ to the CPU in a read cycle. More specifically, the PBSRAM first fetches an address A1 at a rising edge "a" of the clock signal CLK, delivers read data DQ11 from the memory cell having the address A1 together with an echo clock KQ signal at a next rising edge "b". The PBSRAM also delivers read data DQ12 to DQ14 from the addresses succeeding the address A1 together with respective echo clock signals Kq at the succeeding rising dges "c" to "e", thereby executing a burst read operation. similarly, the PBSRAM fetches a next address A2 at a next rising edge "f" and delivers read data DQ21, DQ22, . . . from the addresses starting from the address A2 together with the echo clock signals KQ at the succeeding rising edges of the clock signal CLK.

In the SDR-PBSRAM, the rising edge of the echo clock signal KQ is used for a reference timing for compensating the irregularity of the output timing of the read data DQ. Thus, it is preferable that the timing difference TCHQV or TCHQX between the rising edge of the echo clock signal KQ and the start or end of the level shift caused by the corresponding read data DQ be as small as possible, in view of suppressing the irregularity of the timing difference between the read data and the echo clock signal.

FIG. 1B shows a timing chart for the echo clock signal together with the read data in a double data rate PBSRAM (DDR-PBSRAM). In the DDR-PBSRAM, the timing of output of the read data resides at a rising edge of the echo clock signal KQ as well as a falling edge of the echo clock signal KQ. More specifically, for the read data DQn delivered at the timing of a rising edge of the echo clock signal KQ, the rising edge is the reference to the output timing of the read data, whereas for the read data DQm delivered at the timing of a falling edge of the echo clock signal KQ, the falling edge is the reference to the output timing of the read data. Thus, it is preferable that the timing difference TCHQV or TCLQV between a rising edge of the echo clock signal KQ and the start of the level shift caused by the read data DQ as well as the timing difference TCLQX or TCHQX between a falling edge of the echo clock signal KQ and the start of the level shift caused by the read data DQ be as small as possible.

With the development of higher-operational speed and larger number of bits in data processing by the personal computers, it is a principal subject of the DDR-PBSRAM to obtain an optimum timing between the output of the read data DQ and the echo clock signal KQ, in view that DDR-PBSRAM has a double read rate.

FIG. 2 shows a layout of a conventional DDR-PBSRAM. The DDR-PBSRAM includes a memory cell array 11 including a plurality of memory cells arrayed in a matrix, and a peripheral circuit for controlling the read/write operation for the memory cell array 11. The external clock signal CLK fed through the external pad 10 is used for generating an internal clock signal CLKT which is in phase with the external clock signal CLK and controls the data output sections 2a to 2h and echo clock generators 3a to 3d.

In the exemplified PBSRAM, each of the data output sections 2a to 2h includes four output members. The large number of the output members and the echo clock generators 3a to 3d disposed in a chip causes a distortion in the internal clock signal CLKT. The distortion in the internal clock signal CLKT generates a timing difference between a group of read data DQ13 o DQ16 and DQ17 to DQ20 output from the output sections 2e and 2a near the pad 10 and a group of read data DQ1 to DQ4 and DQ29 to DQ32 output from the output sections 2h and 2d far from the pad 10, as well as a timing difference between the echo clock signals KQ.

The timing difference as described above may be alleviated by the depicted configuration wherein the internal clock signal CLKT is subjected to buffering by using inverters 4a to 4e disposed for this purpose to generate CLKT1 to CLKT4 which are in phase with the external clock signal CLK.

In this situation, it is important to reduce the timing difference between the echo clock signal KQ1 to KQ4 supplied through the echo clock generator 3a to 3d and the read data DQ1 to DQ32 supplied through the data output sections 2a to 2h. This means that the locations of the data output sections 2a to 2h and the echo clock generators 3a to 3d are important as viewed from the input pad 10.

FIG. 3 shows example of the echo clock generators 3a to 3d and the data output sections 2a to 2h in a conventional PBSRAM. The echo clock generator designated by numeral 30 includes a delay gate 31 and an output buffer 32, whereas the data output section designated by numeral 20 includes a data register 21 for latching the data WRB read from a memory cell 23 by a sense amplifier 24 based on the timing of the internal clock signal CLKT, and an output buffer 22.

The output buffer 22 of the data output section 20 receives data WRB stored in the data register 21, delivers the read data DQ at a high level of the data control signal OE and stops the read data DQ at a low level of the data control signal OE.

The output buffer 32 of the echo clock generator 30 iteratively outputs the echo clock signal KQ. Thus, the control signal for the output buffer 32 corresponding to the data control signal OE for the output buffer 22 is fixed to the source potential for enabling the output buffer 32 at any time, as shown in FIG. 3.

The delay gate 31 adjusts the timing of the echo clock signal KQ to be concurrent with the occurrence of the read data. The register 21 includes a master latch and a slave latch cascaded in this order. The data register 21 latches the data WRB at the rising edge of the internal clock signal CLKT and holds therein the data for one clock cycle until the next rising edge of CLKT.

In operation, when a data WRB is latched by the master latch and received in the slave latch of the data register 21 at the rising edge of CLKT, the data WRB in the slave latch is delivered to the output buffer 22 as a read data DQ. This operation of the data register 20 is called "data change" from data WRB to the read data DQ triggered by the rising edge of CLKT.

The delay gate 31 is disposed for adjustment of the timing of the echo clock signal KQ so that the rising edge of the echo clock signal KQ is made concurrent with the timing of the data change in the data register 21 triggered by the rising edge of the internal clock signal CLKT.

In the conventional PBSRAM, the circuit configuration of the data register 21 is different from that of the delay gate 31. This generates an undesirable irregularity in the timing difference between the rising edge of the echo clock signal KQ delivered from the output buffer 32 and the completion of data change in the data register 21 irrespective of the timing adjustment by the delay gate 31, due to the change in the ambient temperature, source voltage etc.

FIG. 4 shows another echo clock generator 30A proposed for alleviating the timing difference generated in the circuit of FIG. 3. The echo clock generator 30A of FIG. 4 includes an output buffer 32 and a pair of latches 33A and 33B which are similar to the latches provided in the data register 21.

The latch. 33A is controlled by the internal clock signal CLKT to latch a high level signal (or source potential) whereas the latch 33B is controlled by a complementary clock signal CLKB of the internal clock signal CLKT to latch a low level signal (or ground level).

In operation of the echo clock signal 30A, the latch 33A latches a high level signal at a rising edge of the internal clock signal CLKT and the high level signal is delivered to the output buffer 32, whereby the output buffer 32 delivers a high level of the echo clock signal KQ.

The echo clock signal KQ remains at a high level so long as the internal clock signal CLKT assumes a high level. In this period of the high level of the internal clock signal CLKT, the latch 33B does not transfer any signal to the output buffer 32 due to a low level of the complementary signal CLKB.

By providing the pair of latches 33A and 33B in the echo clock generator 30A, the echo clock generator 30A generates an echo clock signal KQ in phase with the external cock signal CLK. That is, the latch 33A delivers a rising edge of the echo clock signal KQ by responding to the rising edge of CLKT whereas the latch 33B delivers a falling edge of the echo clock signal KQ by responding to the rising edge of CLKB.

As a result, the interval between the rising edge of CLKT and the rising edge of the echo clock signal KQ (or the timing of the data change) as well as the interval between the rising edge of CLKB and the falling edge of the echo clock signal KQ does not depend on the frequency of the external clock signal CLK.

In other words, the access time between the rising edge of CLKT or CLKB and the timing of the echo clock signal KQ is fixed at a constant and thus does not depend on the frequency of the external clock signal CLK.

On the other hand, in the data output section 20, the data WRB input to the output register 21 is random data read from the memory cell 23, and may be delayed during the transfer of data WRB depending on the conditions of the data path along the sense amplifier 24 and the output register 21.

Accordingly, if the external clock signal CLK has a higher frequency, a time margin for latching the data WRB by the output register 21 is smaller, and in a critical case, the previous data is already transferred to the output buffer 22 before the subject data is transferred to the slave latch of the output register.

The detail of the data register 21 is shown in FIG. 5A. If an input data WRB is latched in the data register 21 at a rising edge of the internal clock signal CLKT, the access time consumed between the rising edge of CLKT and the data change from the input data "IN" to the output of the data "OUT" has a time delay of 0.1 ns (nanosecond) compared to an ordinary operation wherein input data "IN" is latched by the data register 21 with a sufficient time margin.

FIG. 5B shows the access time of the memory device using the data register 21 shown in FIG. 5A plotted against the clock period of the external clock signal CLK.

In the memory device using the data register of FIG. 5A, for the external clock signal CLK having a clock period longer than 3.0 ns, the access time remains at a constant of 2.0 ns due to the time margin for the latching by the data register 21. However, for the external clock signal CLK having a shorter critical clock period of 2.9 ns, the access time rises up to 2.1 ns, as shon in FIG. 5B.

The data register may have a configuration of FIG. 6A for responding to an external clock signal having a higher operational frequency, wherein the data register 21A has a delay gate 27 for delaying the internal clock signal CLKT supplied to the master latch 28 compared to the CLKT supplied to the slave latch 29. In this case, the access time rises from 2.1 ns as described above by the delay time of the delay gate 27, when the input data is latched in the data register 21A by responding to the rising edge of the internal clock signal CLKT input to the master latch 28.

FIG. 6B shows the access time for the PBSRAM having the data register of FIG. 6A plotted against the clock period of the external clock signal CLK. In this case, the access time is constant so long as the clock period of the external clock signal CLK is above 3.0 ns. However, the access time rises up to 2.4 ns for the external clock signal CLK having a shorter critical clock period of 2.6 ns.

More specifically, if the external clock signal CLK has a critical clock period, which is critical for controlling the data output section, the access time involves a delay time of 0.4 ns compared to an ordinary access time of 2.0 ns. And if the delay time of 0.1 ns described above is considered for the delay time of 0.4 ns, a delay time of 0.3 ns is generated due to the delay to the internal clock signal CLKT input to the data output section. Accordingly, the delay gate 27 shown in FIG. 6A improves the operation of the data output section by the delay time of the delay ate 27, wherein the delay gate 27 has a delay time of 0.3 ns in his case.

In the PBSRAM including the data register of FIG. 6A, the access time for the echo clock signal KQ does not depend on the frequency of the external clock signal CLK, whereas the access time for the read data DQ depends on the frequency of the external clock signal CLK for a higher frequency of the external clock signal. Thus, an irregularity is generated in the output timing between the echo clock signal KQ and the read data DQ.

SUMMARY OF THE INVENTION

It is an object of the present invention to provide a PBSRAM generating an echo clock signal, which has less irregularity in the output timing generated between the echo clock signal and the read data due to the difference in the circuit configuration even when the operational frequencies of the echo clock generator and the data output section are critical.

The present invention provides in an embodiment thereof a semiconductor memory device including: a memory cell array including a plurality of memory cells each for storing a data, the memory cell including a first memory cell for storing a high level signal and a second memory cell for storing a low level signal;
- a data read section including first through third sense amplifiers, the first and second sense amplifiers reading data from the first and second memory cells, respectively, the third sense amplifiers reading data from a memory cell specified by an address signal;
- an internal clock signal generator for generating first and second clock signals complementary to each other;
- an echo clock generator including first and second data registers for responding to the first and second clock signals, respectively, to latch data from the first and second sense amplifiers, respectively, and a first output buffer for receiving data alternately from the first and second data registers to output an echo clock signal; and
- a data output section including a third data register for responding to the first clock signal to latch data from the third sense amplifier and a second output buffer for receiving data from the third data register to output read data.

In accordance with the semiconductor memory device of the present invention, since the echo clock generator includes a data register reading data from a memory cell storing specified data and having a configuration similar to the configuration of the data register in the data output section, the echo clock generator generates an echo clock signal substantially at the same timing as the read data output from the data output section. Thus, timing difference between the read data and the echo clock signal can be alleviated.

The above and other objects, features and advantages of the present invention will be more apparent from the following description, referring to the accompanying drawings.

PREFERRED EMBODIMENTS OF THE INVENTION

Figure 1A:
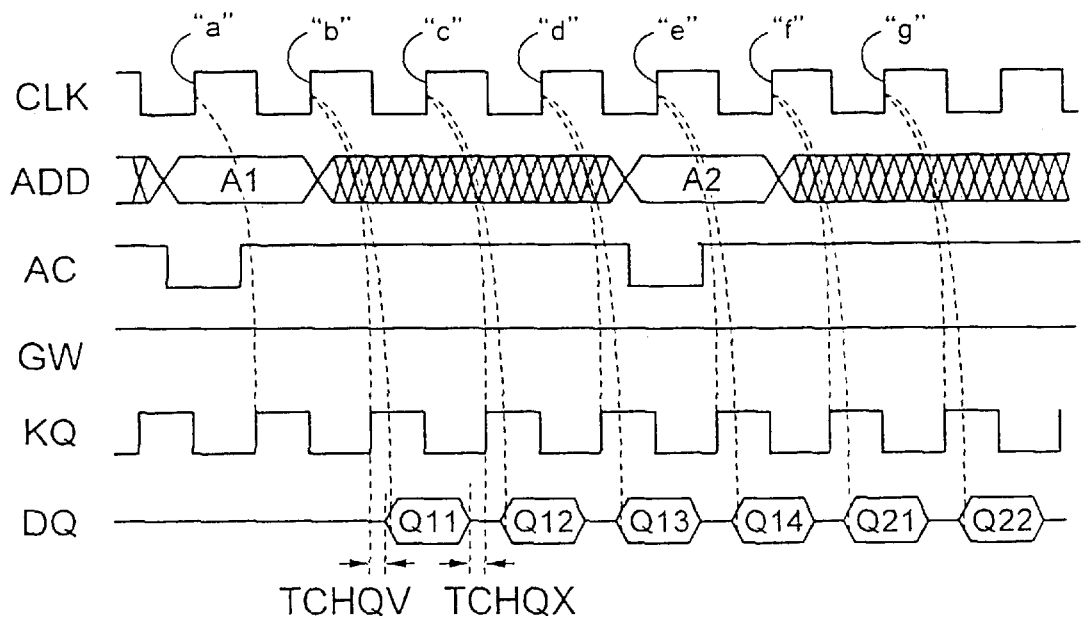
FIGS. 1A and 1B are timing charts of conventional SDR-PBSRAM and a DDR-PBSRAM, respectively.
Figure 1B:
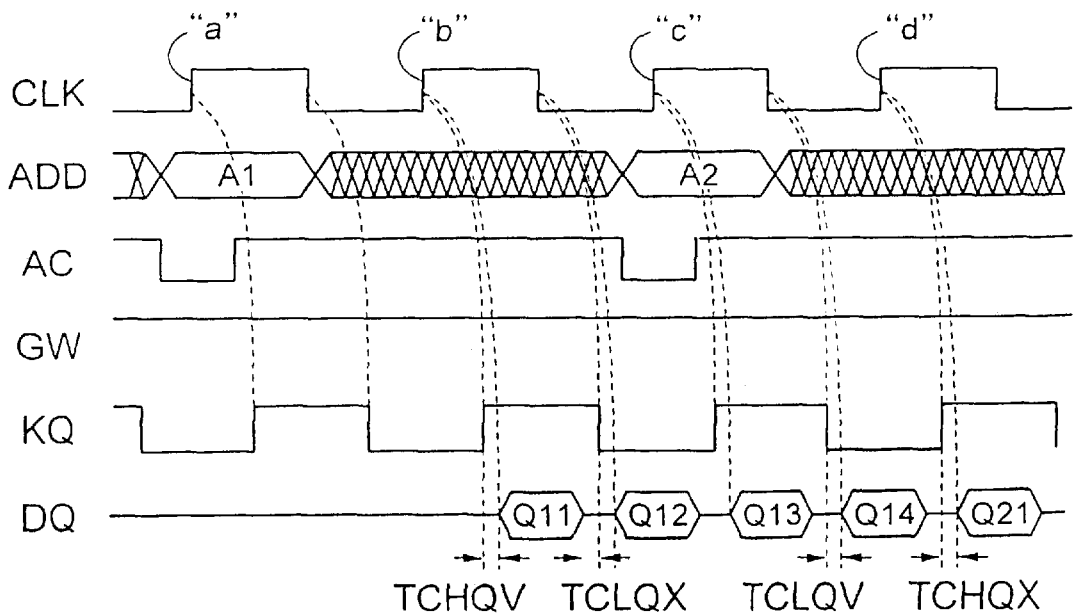

Now, the present invention is more specifically described with reference to accompanying drawings, wherein similar constituent elements are designated by similar reference numerals.

Figure 2:
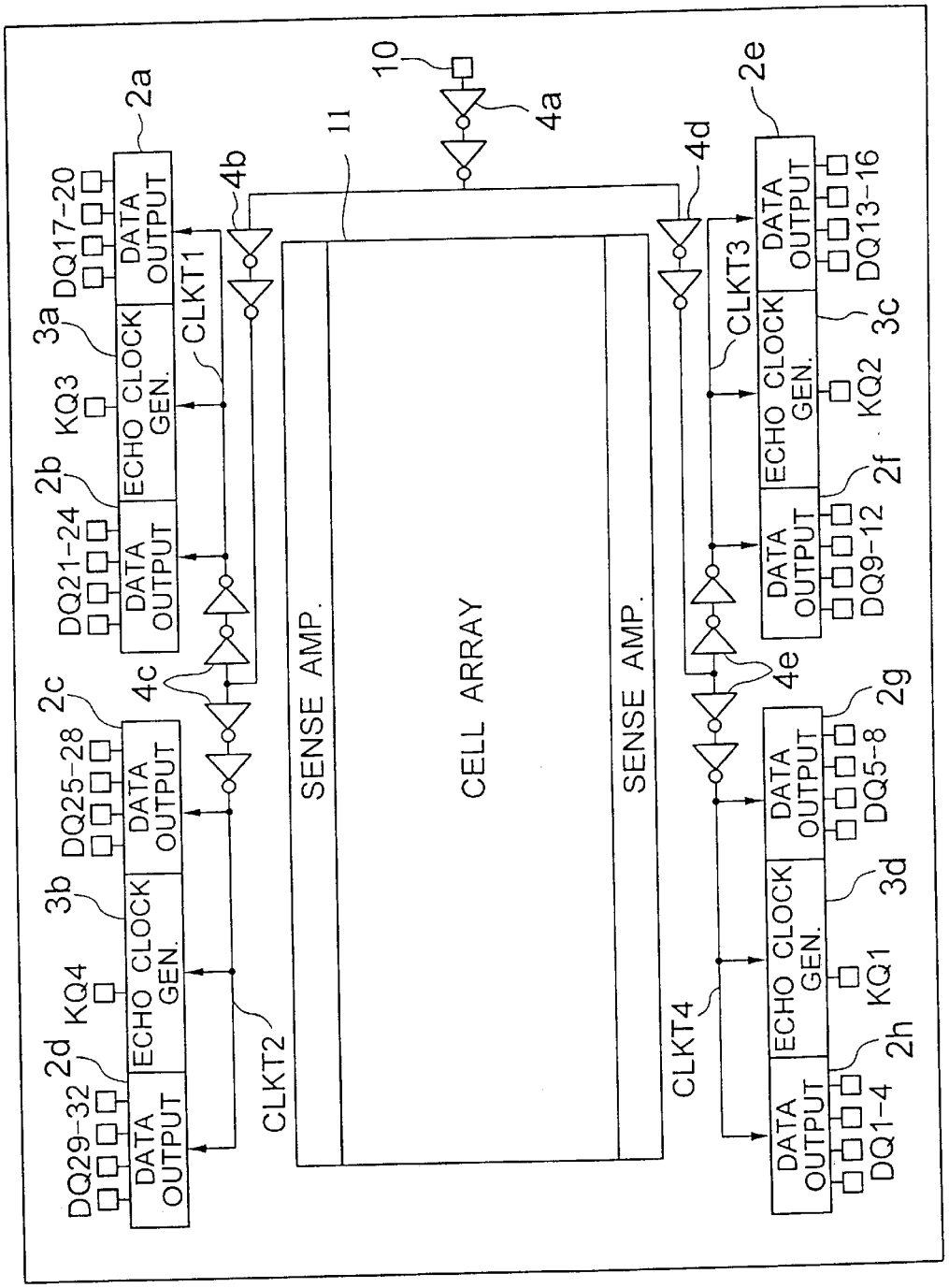
FIG. 2 is a top plan view of a conventional PBSRAM.
Figure 3:
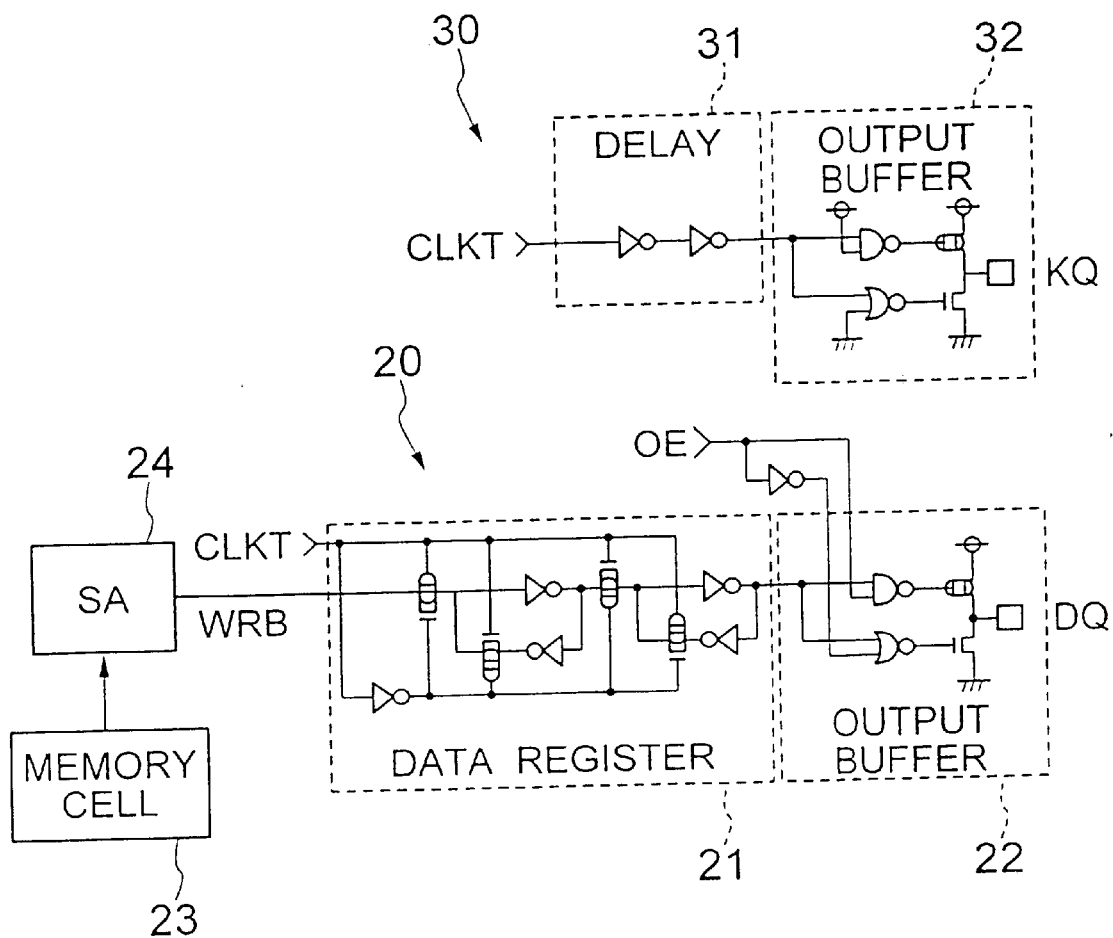
FIG. 3 is a circuit diagram of the echo clock generator and the data output section in a conventional SRAM.
Figure 7:
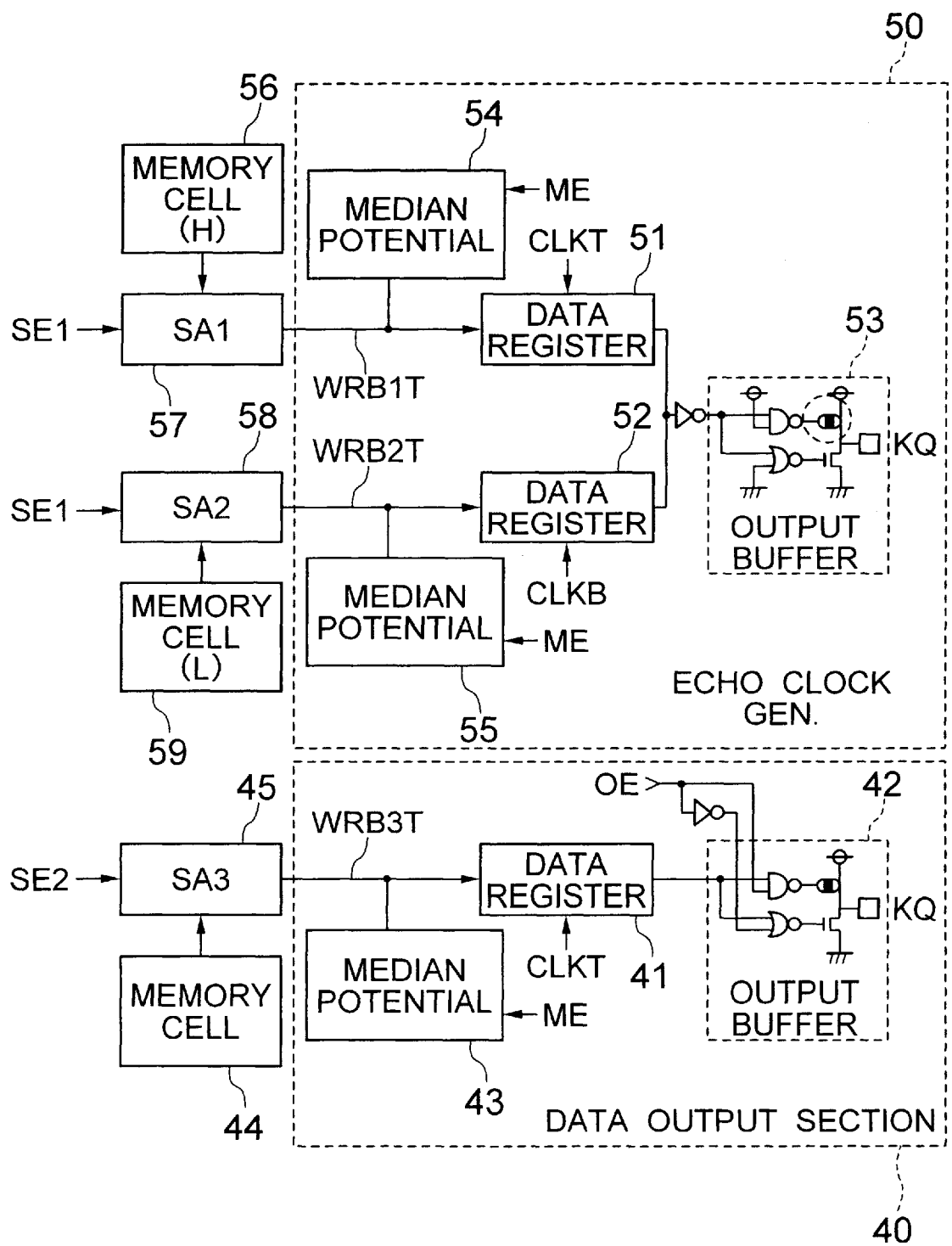
FIG. 7 is a block diagram of a SRAM according to an embodiment of the present invention.

A PBSRAM according to an embodiment of the present invention has a configuration similar to that described with reference to FIG. 2. The description of the conventional SRAM with reference to FIG. 2 is incorporated herein by reference. The PBSRAM according to the present embodiment includes echo clock generators and data output sections such as shown in FIG. 7.

In short, the echo clock generator 50 includes first and second data registers 51 and 52, whereas the data output section 40 includes a third data register 41 which receives data from memory cells 44. The first data register 51 receives an output from a first sense amplifier (SA1) 57 which delivers a high level signal at any time, by responding to the internal clock signal CLKT. The second data register 52 receives an output from a second sense amplifier (SA2) 58 which delivers a low level signal at any time, by responding to the complementary clock signal CLKB. The first and second sense amplifiers 57 and 58 receives data from respective memory cells 56 and 59 having data fixed to a high level and a low level, respectively. This allows the first and second data registers 51 and 52 in the echo clock generator 50 to latch the read data at the same timing as the third data register 41 in the data output section 40 which read data from a memory cell specified by an address signal.

The output of each of the first through third sense amplifiers 45, 57 and 58 is connected to an output of a median potential circuit 43, 54 or 55, which operates for applying a median potential to the output of the corresponding sense amplifier at a specified timing. This configuration assists the first and second data registers 51 and 52 in the echo clock generator 50 to latch the read data at the same timing as the third data register 41 in the data output section 40.

In the present embodiment, the conditions under which the data read from the memory cell is latched by the data register 51 or 52 in the echo clock generator 50 are similar to the conditions under which data is latched by the data register 41 in the data output section 40. In additon, the signal path for the echo clock signal KQ is similar to the signal path for the read data DQ. This allows the echo clock signal KQ to have a frequency dependency upon the internal clock signals CLK and CLKB similar to the frequency dependency of the read data upon the external clock signal, whereby the timing difference between the echo clock signal Kq and the read data DQ can be eliminated.

More specifically, in FIG. 7, the echo clock signal generator 50 includes an output buffer 53, the first and second data registers 51 and 52 each for receiving data from a corresponding sense amplifier 57 or 58, and the median potential circuits 54 and 55 each disposed for a corresponding one of the first and second data registers 51 and 52. The first data register 51 is controlled by the internal clock signal CLKT, and receives data WRB1T from the sense amplifier 57 which receives data from a memory cell 56 having data fixed to a high level. The second data register 52 is controlled by the complementary clock signal CLKB, and receives data WRB2T from the sense amplifier 58 which receives data from a memory cell 59 having data fixed to a low level.

Figure 4:
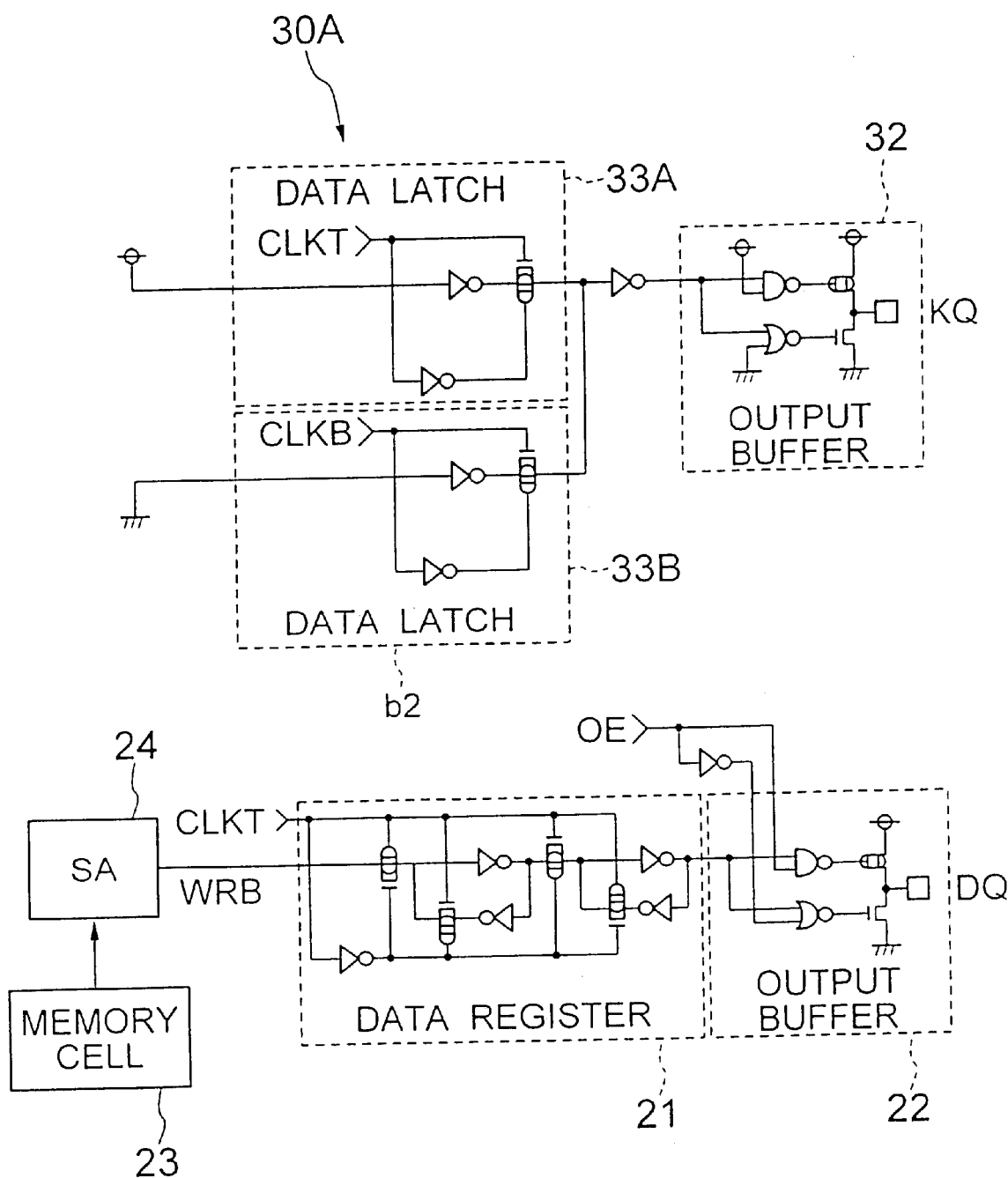
FIG. 4 is a circuit diagram of the echo clock generator and the data output section in another conventional SRAM.

In the above embodiment, the data stored in the memory cells 56 and 59 are fixed to high and low levels, respectively. If the sense amplifier 57 or 58 can deliver a high level data or a low level data at any time, the configuration is not limited to the embodiment. For example, if it is sufficient that a rising edge of the echo clock signal KQ be concurrent with the output timing of the read data DQ, the memory cell 59, the median potential circuit 55 and the data register 52 in FIG. 7 may be replaced by a latch, such as the latch 33B shown in FIG. 4.

Figure 8A:
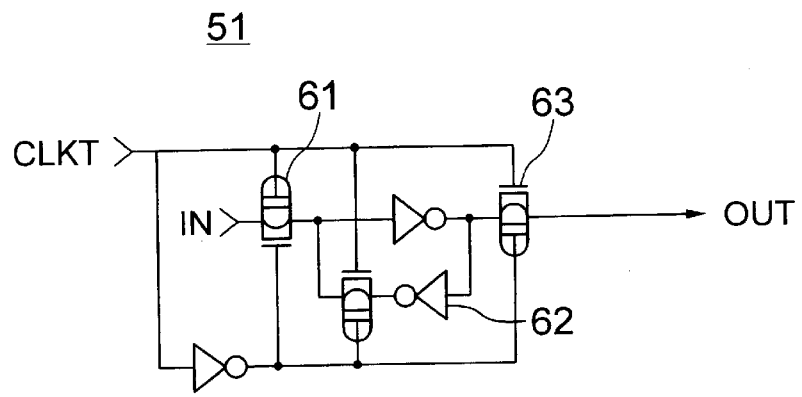
FIGS. 8A, 8B and 8C are circuit diagrams of examples of data register, data register and median voltage circuit, respectively.
Figure 8B:
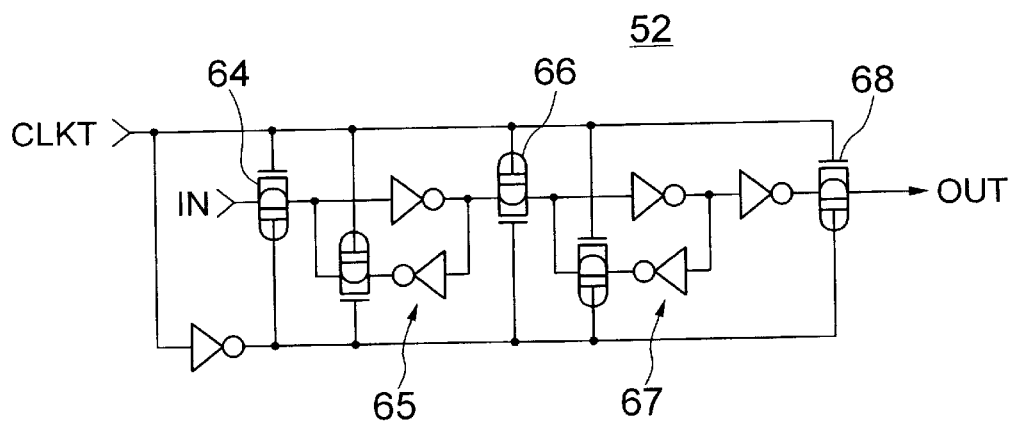

The first data register 51 controlled by the internal clock signal CLKT may have a configuration such as shown in FIG. 8A, whereas the second data register 52 controlled by the complementary clock signal CLKB may have a configuration such as shown in FIG. 8B.

In FIG. 8A, the first data register 51 has a first transfer gate 61 for responding to a low level of CLKT to receive an input data, a feed back loop 62 for responding to a rising edge of CLKT to latch the received data after inversion thereof, and a second transfer gate 63 for responding to a high level of CLKT to output the received data after inversion thereof.

The second data register 52 includes a first transfer gate 64 for responding to a high level of CLKB to receive an input data, a first feedback loop 65 for responding to a falling edge of CLKB to latch the received data after inversion thereof, a second transfer gate 66 for responding to a low level of CLKB to pass the inverted received data, a second feedback loop 67 for responding to the rising edge of CLKB to latch the received data, and a third transfer gate 68 for responding to a high level of CLKB to pass the received data through an inverter. By these configurations, the second data register 52 latches the data WRB2T at the same timing as the first data register 51 which latches data WRB1T at the rising edge of CLKT, whereas the second data register 52 delivers an output thereof a half clock cycle after the first data register 51 delivers an output thereof.

Figure 8C:
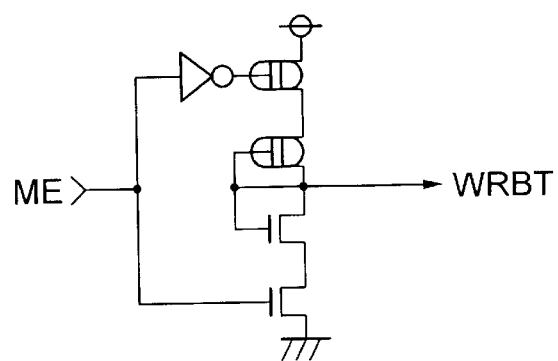

Each median potential circuit 54 or 55 has a configuration such as shown in FIG. 8C, which outputs a median potential or central potential between the source potential and the ground potential, by responding to a median potential signal ME.

Figure 5A:
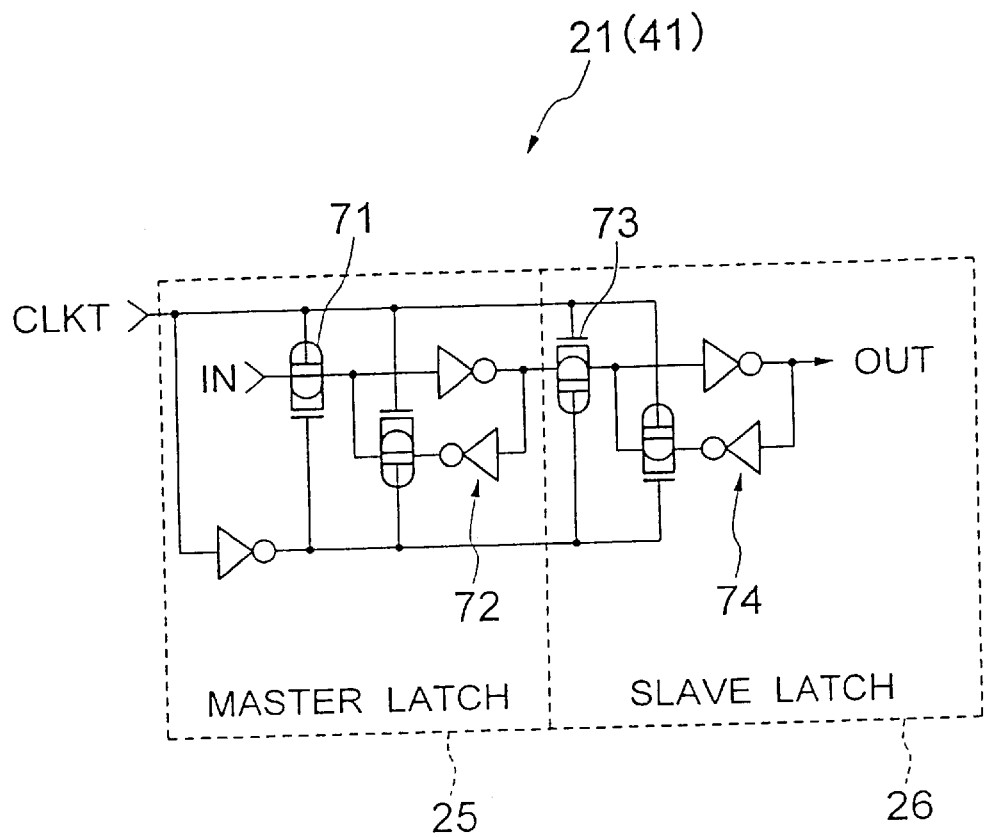
FIG. 5A is a circuit diagram of a data register in the data a output section in a conventional SRAM which alleviates the timing difference between the echo clock signal and the read data.
Figure 5B:
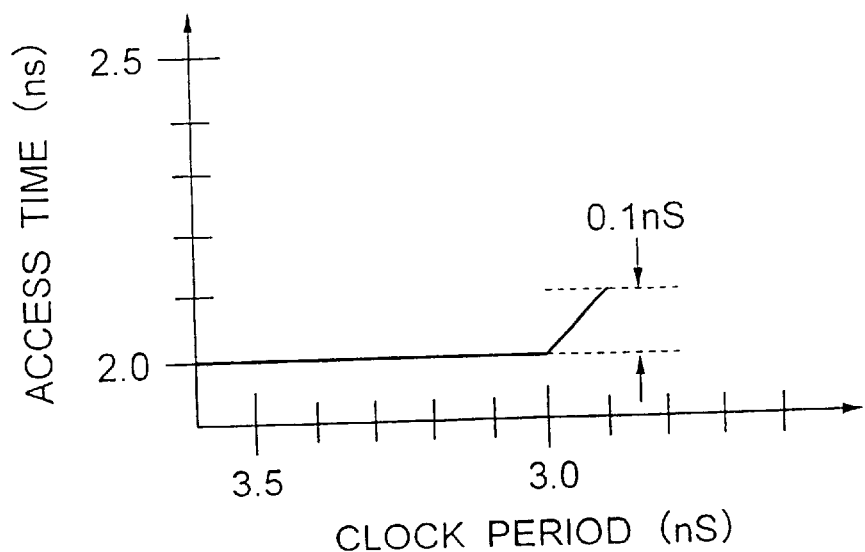
FIG. 5B is a graph showing an access time thereof plotted against the clock period of the external clock signal.
Figure 6A:
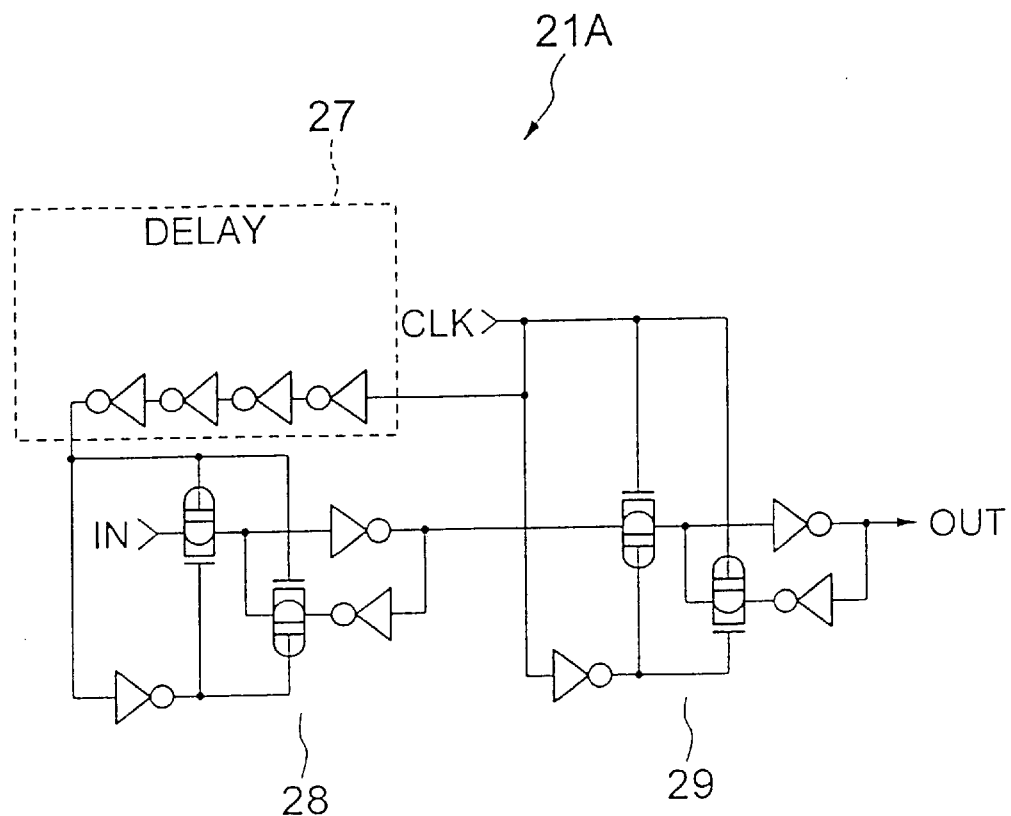
FIG. 6A is a circuit diagram of a data register in the data output section in another conventional SRAM which alleviates the timing difference between the echo clock signal and the read data.
Figure 6B:
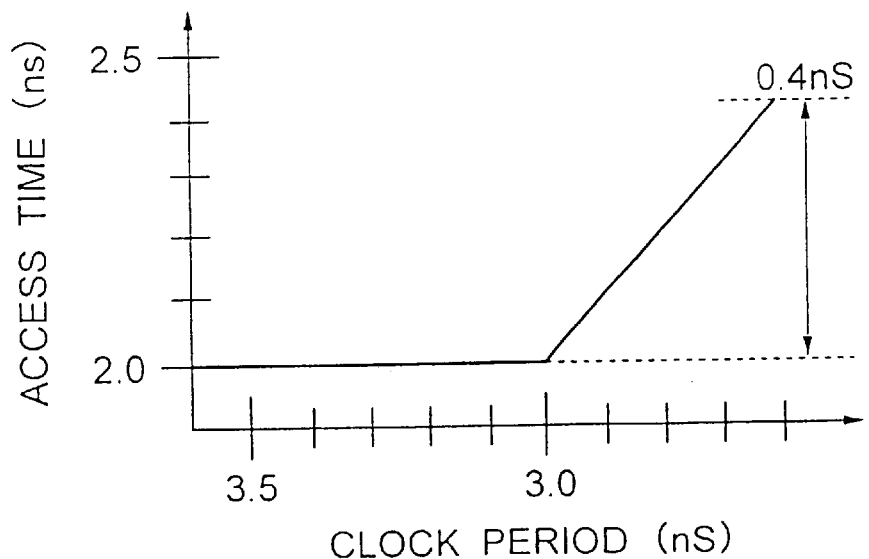
FIG. 6B is a graph showing an access time thereof plotted against the clock period of the external clock signal.

Back to FIG. 7, the data output section 40 includes a median potential circuit 43, third data register 41 and an output buffer 42. The third data register 41 has a configuration such as shown in FIG. 5A, including a master latch 25 and a slave latch 26 cascaded in this order. The master latch 25 includes a first transfer gate 71 for responding to a low level of the external clock signal CLK to receive data read from a memory cell, a first feedback loop 72 for responding to a rising edge of CLK to latch the received data after inversion thereof. The slave latch 26 includes a second transfer gate 73 for responding to a high level of CLK to pass the inverted received data, and a second feedback loop 74 for responding to the falling edge of CLK to latch the inverted received data after further inversion. The median potential circuit 43 has a configuration shown in FIG. 8C.

Figure 9:
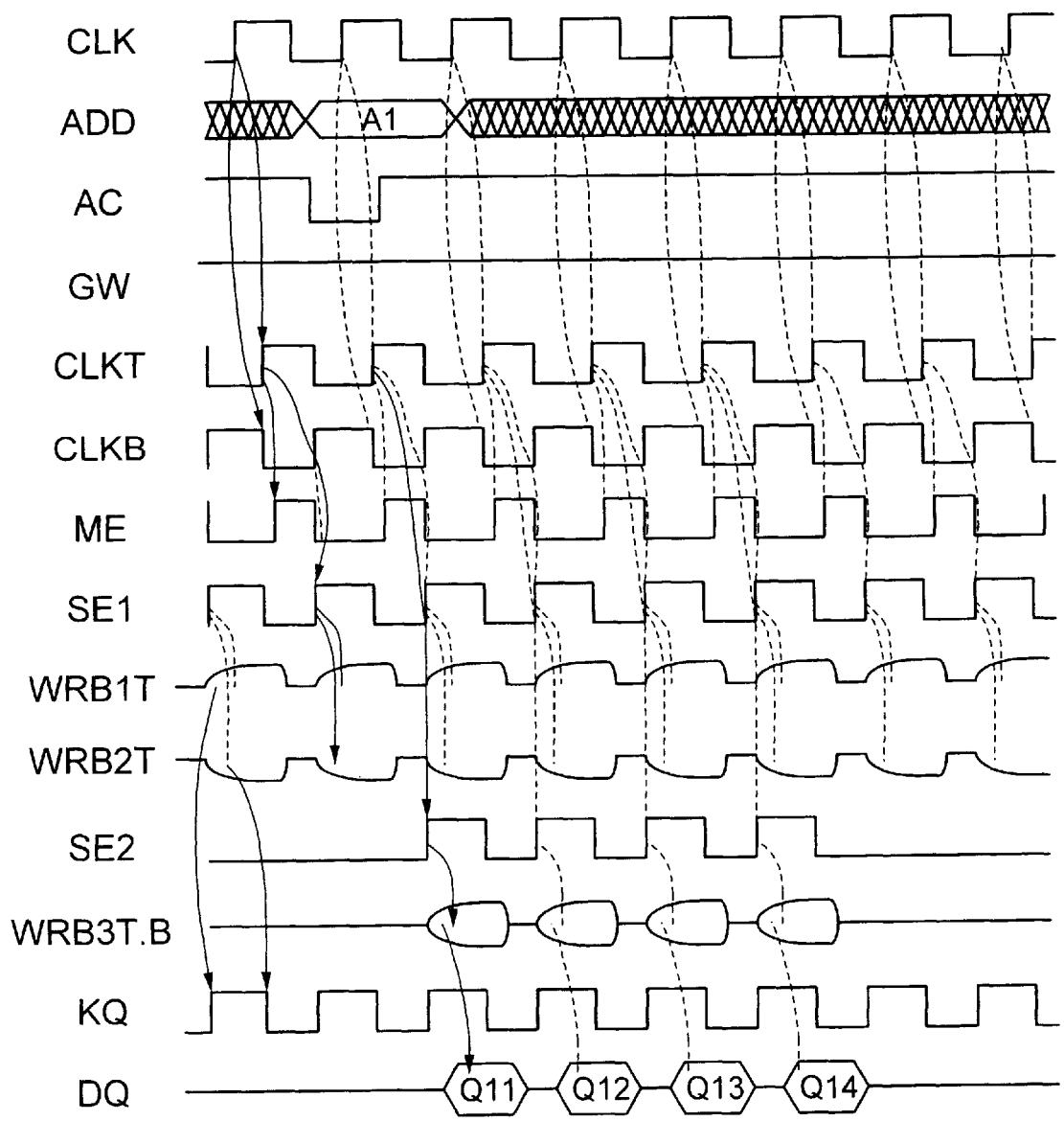
FIG. 9 is a timing chart of the SRAM of FIG. 7.

FIG. 9 shows a timing chart of the PBSRAM of the present embodiment. In operation, the PBSRAM starts for reading data in a read mode when the address control signal AC and the write enable signal GW assume a low level and a high level, respectively, whereas the PBSRAM starts for writing data in a write mode when both the address control signal AC and the write enable signal GW assume a low level.

In the read mode, after an address signal A1 is latched at a rising edge of the external clock signal CLK, the sense amplifiers 57, 58 and 45 starts for reading data from respective memory cells 56, 59 and 44.

In the echo clock generator 50, the first data register 51 latches the data WRB1T from the sense amplifier 57 at the rising edge of the internal clock signal CLKT whereas the second data register 52 latches the data WRB2T from the sense amplifier 58 at a falling edge of the complementary clock signal CLKB.

In the data output section 40, the third data register 41 latches the data WRB3T from the sense amplifier 45 at the rising edge of CLKT.

Each of the first through third data registers 51, 52 and 41 includes at least one latch or feedback loop, which holds the received data during the next high level of CLKT or the next low level f CLKB. Thus, the input of each data register 51, 52 or 41 can be applied with a median potential by the corresponding median potential circuit 54, 55 or 43 without causing any change in the received data during the high level of CLKT and the low level of CLKB.

Each median potential circuit 54, 55 or 43 responds to a high level of the median potential signal ME which rises during the high level of CLKT and falls concurrently with CLKT, thereby applying a median potential to the output of a corresponding sense amplifier 57, 58 or 45 or the input of a corresponding data register 51, 52 or 41.

Since the second data register 52 controlled by the complementary clock signal CLKB includes three transfer gates 64, 66 and 68 and two latches 65 and 67, the second data register 52 latches data at the same timing as the first data register 51, whereby the second median potential circuit 55 applies the median potential at the same timing as the first or three median potential circuit 54 or 43 without causing any change of received data. Thus, a common median potential signal ME can be used for the first through third median potential circuits 54, 55 and 43.

It is to be noted that the median potential signal ME must be lowered to a low level to disable the median potential circuits 54, 55 and 43 before the timing at which the sense amplifiers 57, 58 and 45 are enabled by raising the level of the sense amplifier enable signals SE1 and SE2.

If the median potential circuits 54, 55 and 43 are enabled at the timing wherein the sense amplifiers 57, 58 and 45 are enabled to the contrary, the data change of WRB1T and WRB2T to an echo clock signal in the echo clock signal generator 50 and the data change of WRB3T to read data DQ are delayed, which is undesirable.

Since the cell data to be read by the first sense amplifier 57 is at a high level at any time, the data WRB1T output from the sense amplifier 57 assumes a high level and received by the first data register 51 at the rising edge of CLKT. The received data is immediately transferred to the output buffer 53, which delivers a high level of the echo clock signal KQ.

During the time interval when CLKT assumes a high level, the echo clock signal KQ remains at the high level. On the other hand, since CLKB is at low level during the time interval when CLKT is at a high level, the second output register 52 does not deliver data therefrom.

Since the cell data to be read by the second sense amplifier 58 is fixed to a low level, the data WRB2T output from the sense amplifier 58 assumes a low level, and is received by the second data register 52 at the rising edge of CLKB. The received data is immediately transferred to the output buffer 53, which delivers a low level of the echo clock signal KQ.

During the low level of CLKB input to the second data register 52, the echo clock signal KQ remains at a low level. On the other hand, since CLK assumes a low level during a high level of the CLKB, the first data register does not deliver any data to the output buffer.

After the read operation is started by input of the rising edge of the external clock signal CLK, the third sense amplifier 45 reads data at the rising edge of the sense amplifier enable signal SE2, delivers data WRB3T to the third data register 41. The third data register 41 receives data WRB3T at a rising edge of CLKT and delivers the same to the output buffer 42, which delivers the read data DQ. The third data register 41 holds the data WRB3T, received from the sense amplifier 45, until the next rising edge of CLKT.

It is to be noted that the sense amplifier enable signal SE1 for enabling the first and second sense amplifiers 57 and 58 must be generated at any time for the echo clock generator 50. On the other hand, it is sufficient that the sense amplifier enable signal SE2 for enabling the third sense amplifier 45 be generated at the timing of the read operation for the data output section 40.

However, in view that it is sufficient to operate the first through third data registers 51, 52 and 41 during the read operation for obtaining the timing of the echo clock signal KQ, the median potential signal ME may be generated at the timing of the read operation. This allows the sense amplifier enable signals SE1 and SE2 to be generated at the same timing.

As described above, since the outputs of the sense amplifiers 57, 58 and 45 are fixed at a median potential at a specified timing in the SRAM of the present embodiment, the timing of the echo clock signal KQ can be matched with the timing of the output of the read data.

It is to be noted that the above function can be obtained by equalizing the delays of the data transferred from the respective sense amplifiers 57, 58 and 45 to the respective data registers 51, 52 and 41. This configuration allows the echo clock signal and the read data to have a similar frequency dependency, which reduces the timing difference therebetween.

In the exemplified embodiment, the PBSRAM has a latency of two cycles and a burst length of four. However, the latency and the burst length may be selected as desired.

Figure 10:
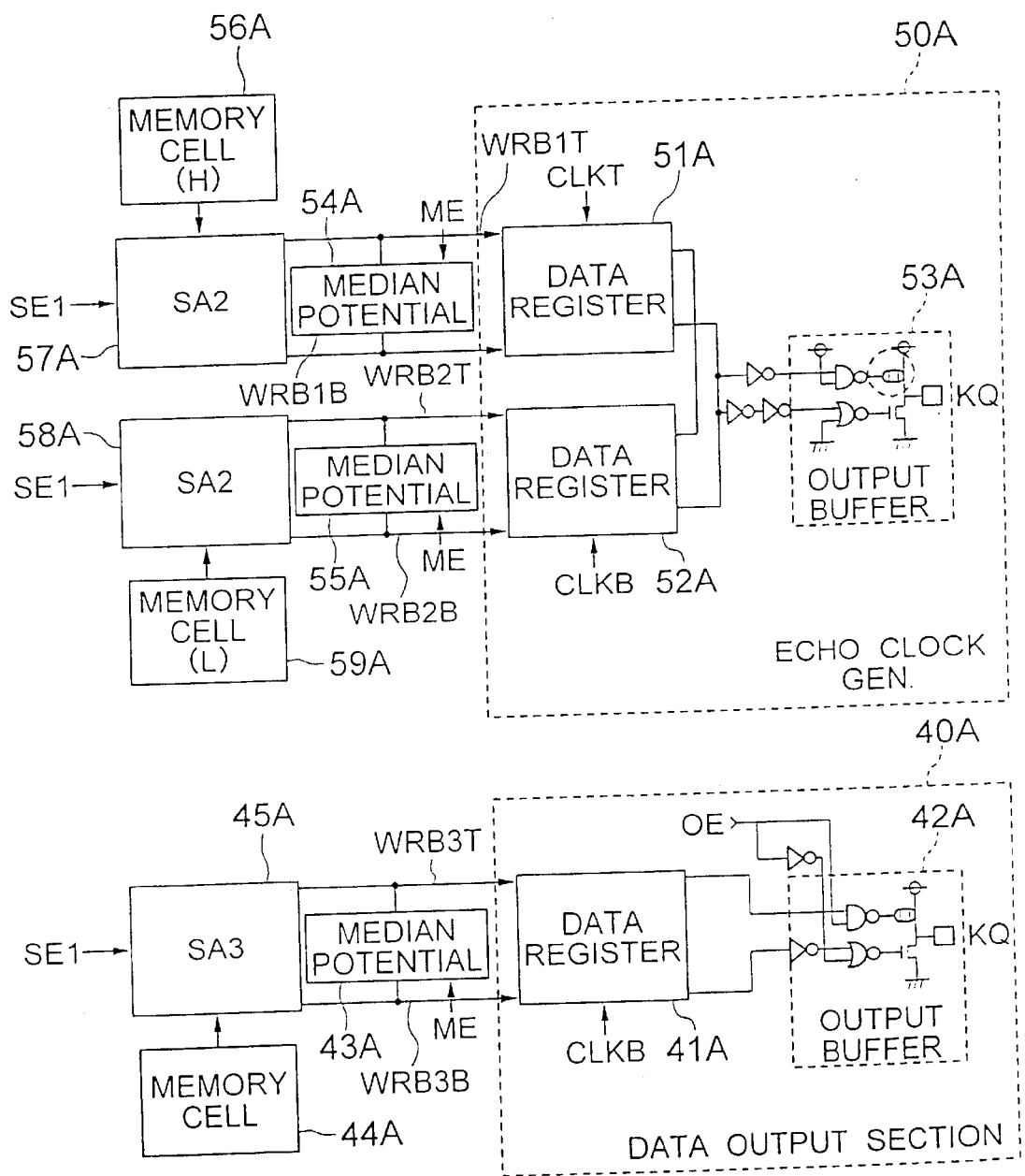
FIG. 10 is a circuit diagram of the echo clock generator and the data output section in the SRAM of FIG. 7.

Referring to FIG. 10, a PBSRAM according to a second embodiment of the present invention is similar to the first embodiment except that each sense amplifier 57A, 58A or 45A delivers a pair of complementary signals and that the median potential circuit 43A, 54A or 55A is implemented by an equalizer for equalizing the potentials of the pair of signal lines carrying the complementary signals in the present embodiment. This configuration affords an advantage in that the power dissipation can be reduced.

FIGS. 11A to 11D show the third data register 41A, the first data register 51A, the second data register 52A and the median potential circuit 43A, 54A or 55A, respectively, shown in FIG. 10. Each of these circuits receives and delivers complementary signals.

Figure 11A:
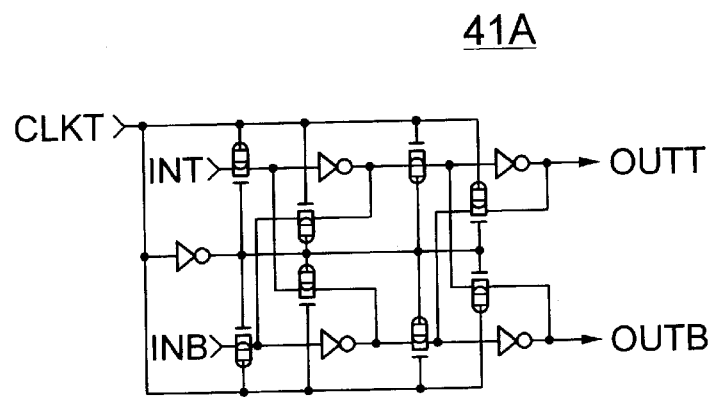
FIGS. 11A to 11D are circuit diagrams of examples of the data register in the data output section in FIG. 10, and a circuit diagram of the median voltage circuit.
Figure 11B:
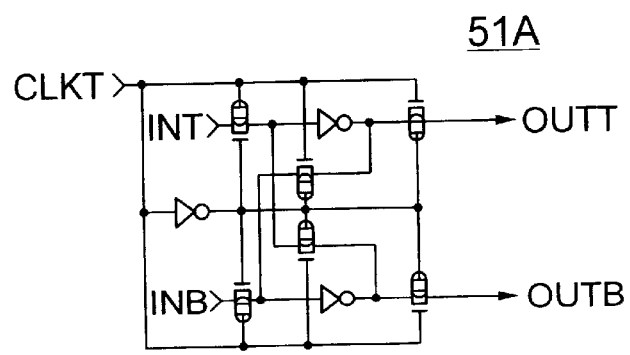
Figure 11C:
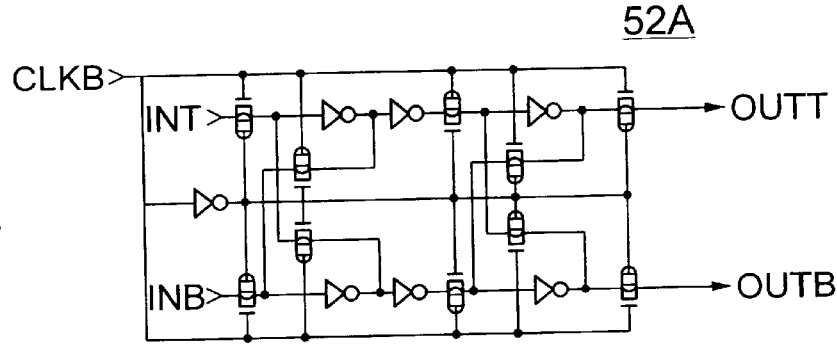
Figure 11D:
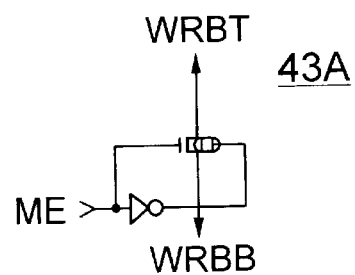
Figure 12A:
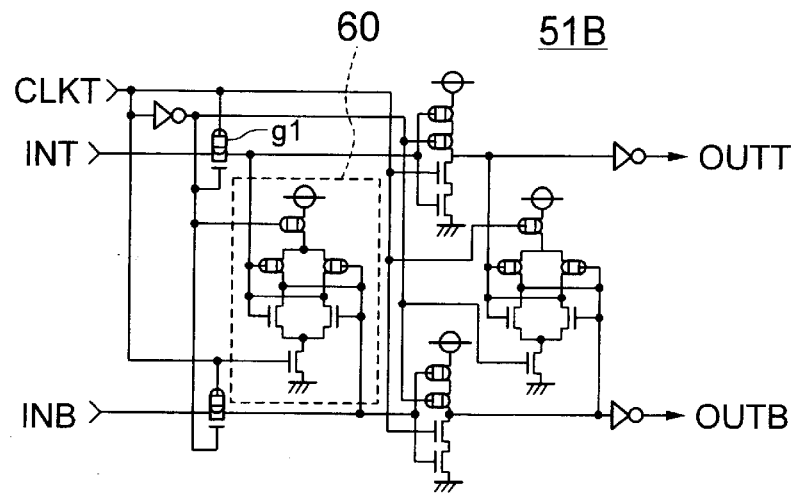
FIGS. 12A to 12C are circuit diagrams of other examples of the data register in the data output section in FIG. 10.
Figure 12B:
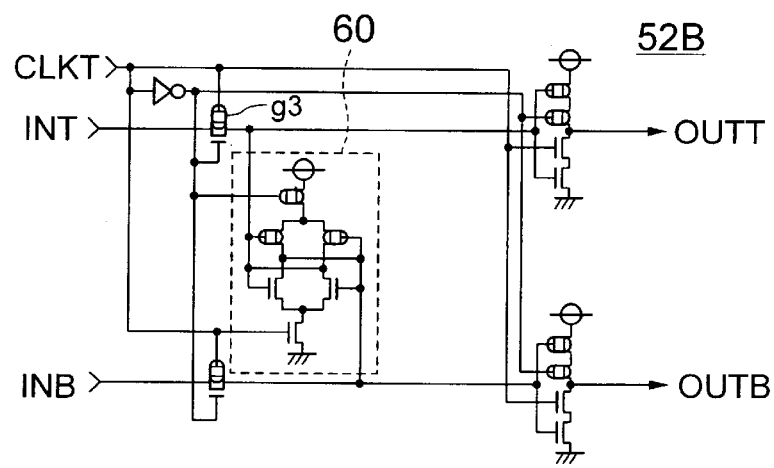
Figure 12C:
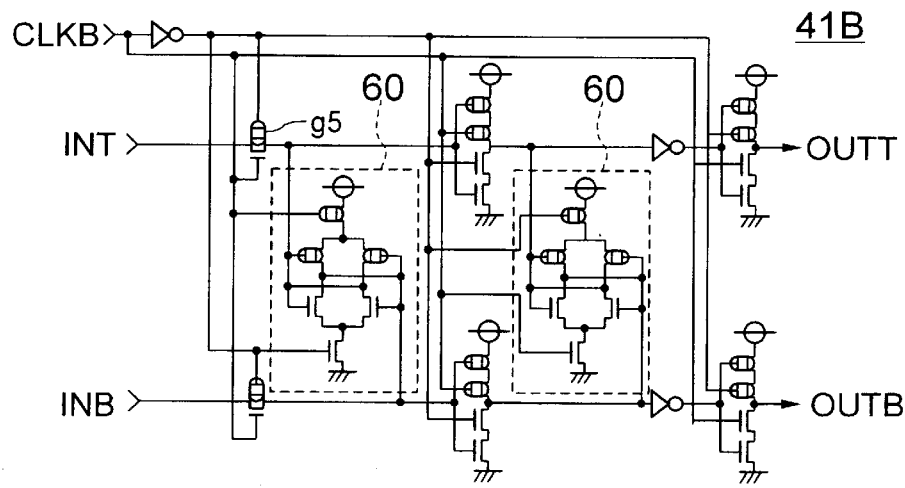

Referring to FIGS. 12A, 12B and 12C showing alternatives to the data registers shown in FIGS. 11A, 11B and 11C, each of the data registers 51B, 52B and 41B has a latch 60 which has a function of amplifying the complementary signals having a smaller amplitude. This configuration allows a higher speed operation of the PBSRAM.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory device comprising:
a memory cell array including a plurality of memory cells each for storing a data, said memory cells including a first memory cell for storing a high level signal and a second memory cell for storing a low level signal;
a data read section including first through third sense amplifiers, said first and second sense amplifiers reading data from said first and second memory cells, respectively, said third sense amplifier reading data from a memory cell specified by an address signal;
an internal clock signal generator for generating first and second clock signals complementary to each other;
an echo clock generator including first and second data registers for responding to said first and second clock signals, respectively, to latch data from said first and second sense amplifiers, respectively, and a first output buffer for alternately receiving data from said first and second data registers to output an echo clock signal; and
a data output section including a third data register for responding to said first clock signal to latch data from said third sense amplifier and a second output buffer for receiving data from said third data register to output read data.

2. The semiconductor memory device as defined in claim 1, wherein said first data register includes a single latch for responding to a rising edge of said first clock signal to latch the data, said second data register includes a master latch and a slave latch, the slave latch of said second data register responding to a rising edge of said second clock signal to latch the data, and said third data register includes a master latch and a slave latch, the slave latch of said third data register responding to a rising edge of said first clock signal to latch the data.

3. The semiconductor memory device as defined in claim 2, wherein said first and second data registers concurrently receives respective data and alternately outputs respective data.

4. The semiconductor memory device as defined in claim 1, further comprising a median potential circuit for applying a median potential to an output of each of said first through third sense amplifiers at a specified timing.

5. The semiconductor memory device as defined in claim 4, wherein each of said sense amplifiers and data registers transfers a pair of complementary signals, and said median potential circuit is implemented by an equalizer for equalizing the potentials of said complementary signals.

6. The semiconductor memory device as defined in claim 5, wherein each of said data registers includes a latch having a function for amplifying said pair of complementary signals.

7. A semiconductor memory device comprising:

a memory cell array including a plurality of memory cells each for storing a data, said memory cells including a first memory cell for storing a high level signal or a low level signal;

a data read section including first and second sense amplifiers, said first sense amplifier reading data from said first memory cell, said second sense amplifier reading data from a memory cell specified by an address signal;

an echo clock generator including a first data register for responding to a first clock signal to latch data from said first sense amplifier, and a first output buffer for receiving data from said first data register to output an echo clock signal; and a data output section including a second data register for responding to said first clock signal or said second clock signal complementary to said first clock signal to latch data from said second sense amplifier and a second output buffer for receiving data from said second data register to output read data.

8. The semiconductor memory device as defined in claim 7, wherein said echo clock generator further includes a third data register for receiving a first data having a low level or a high level depending on the high level or the low level signal stored in said first memory cell, and delivers the first data to said first output buffer alternately with said first data register to generate said echo clock signal.

* * * * *